(12) United States Patent
Lung et al.

(10) Patent No.: US 9,646,692 B1
(45) Date of Patent: May 9, 2017

(54) PROGRAMMING VERIFY FOR NONVOLATILE MEMORY

(71) Applicant: MACRONIX INTERNATIONAL CO., LTD., Hsinchu (TW)

(72) Inventors: Hsiang-Lan Lung, Kaohsiung (TW); Hsin Yi Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/965,670

(22) Filed: Dec. 10, 2015

(51) Int. Cl.
*G11C 13/00* (2006.01)

(52) U.S. Cl.
CPC ...... *G11C 13/0069* (2013.01); *G11C 13/0004* (2013.01); *G11C 13/004* (2013.01); *G11C 13/0064* (2013.01)

(58) Field of Classification Search
CPC .................................................. G11C 13/0004
USPC ..................................................... 365/185.17
See application file for complete search history.

(56) References Cited

U.S. PATENT DOCUMENTS

| | | | |
|---|---|---|---|
| 5,335,202 A | 8/1994 | Manning et al. | |
| 6,335,881 B2 * | 1/2002 | Kim | 365/185.17 |
| 8,355,283 B2 * | 1/2013 | Roohparvar | G11C 16/26 365/185.17 |
| 8,508,998 B2 | 8/2013 | Haukness | |
| 2010/0271861 A1 * | 10/2010 | Kitagawa | G11C 13/0009 365/148 |
| 2011/0161571 A1 * | 6/2011 | Kim | G11C 11/5628 711/103 |
| 2012/0225532 A1 * | 9/2012 | Hautala | H01L 45/04 438/382 |
| 2014/0313844 A1 * | 10/2014 | Lin | H03K 5/003 365/230.01 |

* cited by examiner

*Primary Examiner* — Min Huang
(74) *Attorney, Agent, or Firm* — Yiding Wu; Haynes Beffel & Wolfeld LLP (57) ABSTRACT

A memory device includes an array of programmable resistance memory cells, a differential amplifier coupled to the array, and current circuitry providing a program current to the bit line. The differential amplifier senses a voltage difference between a first voltage on a bit line coupled to a memory cell and a reference voltage, and provides a feedback signal in response to the voltage difference. Control circuitry is coupled to the array and the differential amplifier, and configured to execute a program operation to change the memory cell in a first resistance state to a second resistance state, including selecting a voltage level for the reference voltage which correlates with the second resistance state, turning on the current circuitry to apply a program pulse of program current to the memory cell, and enabling the differential amplifier, where the current circuitry turns off the program current in response to the feedback signal.

17 Claims, 6 Drawing Sheets

PROGRAMMING VERIFY FOR NONVOLATILE MEMORY

BACKGROUND

Field of the Technology

The technology disclosed relates to memory devices based on phase change memory materials, like chalcogenides, and on other programmable resistance materials, and methods for operating such devices.

Description of Related Art

In some programmable resistance memory array configurations, each memory cell includes a diode or a transistor in series with a programmable resistance memory element. The diode or transistor acts as an access device, so that memory cells can be selected for program or read operations, while current flow in unselected memory cells is blocked.

One type of programmable resistance memory element includes phase change material that exhibit a large resistivity contrast between crystalline (low resistivity) and amorphous (high resistivity) phases. Phase change materials may include chalcogenides, and other alloys of materials such as germanium (Ge), antimony (Sb), tellurium (Te), gallium (Ga), indium (In), silver (Ag), selenium (Se), thallium (Ti), bismuth (Bi), tin (Sn), copper (Cu), palladium (Pd), lead (Pb), sulfur (S), and gold (Au). In normal operation of a phase change memory element, an electrical current pulse passed through the phase change memory cell can set or reset the resistivity phase of the phase change memory element. To reset the memory element into the amorphous phase, an electrical current pulse with a large magnitude for a short time period can be used. To set the memory element into the crystalline phase, an electrical current pulse with an intermediate magnitude and a longer time period can be used. To read the state of the memory element, a small voltage is applied to the selected cell and the resulting electrical current is sensed. The sensed current may have at least two current levels, one very low for a high resistance state, and another higher for a low resistance state. Accordingly, an electrical current is used when an operation is needed to set, reset or read the resistivity state of a selected memory cell.

Memory cells in phase change memory devices experience a statistical process variation during program operations, resulting in normal distributions for respective resistance ranges that represent logic levels. A very small portion of memory cells in a phase change memory array can fall out of the normal distributions, and are referred to as tail bits. Tail bits can affect the reliability of phase change memory devices, especially in MLC (multiple level cell) phase change memory devices, where the resistance ranges are closer to each other than in SLC (single-level cell) phase change memory devices.

A set-verify-set operation is a way to fix the tail bits during set operations to set memory elements into the crystalline phase. In a set-verify-set operation, a set pulse is applied to a memory element and subsequently a verify pulse is applied to the memory element to verify whether the memory element is set to within an expected range of resistance. If not, another set pulse is applied to the memory element, and the set-verify-set operation is repeated until the memory element is set to within the expected range of resistance. However, the set-verify-set operation can impact the program performance of the memory device, because to switch between a set operation and a verify operation for a memory cell, the bias arrangements for the bit line and word line coupled to the memory cell must be changed.

It is desirable to provide technology which can improve the program performance of a phase change memory device.

SUMMARY

The present technology describes a device and method to change the memory cell in a first resistance state to a second resistance state, without requiring, or reducing the need for, repetitive set and verify pulses as in the traditional set-verify-set operation. During a set operation on a memory cell, a program pulse of program current is applied to the memory cell, and the power delivered for a set operation, such as by adjusting the width of the program current pulse, can be controlled in response to monitoring resistance in the memory cell.

As used herein, the term "program" can refer to a reset operation to reset a memory element in a memory cell into the amorphous phase, and to a set operation to set the memory element into the crystalline phase. The term "program pulse" can refer to an electrical pulse used in a reset operation, and to an electrical pulse used in a set operation. A program pulse can be characterized by a magnitude in current or voltage, a time duration, a rise time of a rising edge, and a fall time of a falling edge. The term "program current" can refer to an electrical current provided to a memory cell during a set operation or a reset operation to change the resistance state of the memory cell.

A memory device is provided that includes an array of programmable resistance memory cells, and a differential amplifier coupled to the array. The differential amplifier senses a voltage difference between a first voltage on a bit line coupled to a memory cell in the array and a reference voltage, and provides a feedback signal in response to the voltage difference. Current circuitry, such as a constant current source circuit, is coupled to the bit line to provide a program current to the bit line coupled to the memory cell.

The memory device includes control circuitry coupled to the array and the differential amplifier, and configured to execute a program operation to change the memory cell in a first resistance state to a second resistance state including selecting a voltage level for the reference voltage which correlates with the second resistance state, turning on the current circuitry to apply a program pulse of program current to the memory cell, and enabling the differential amplifier, where the current circuitry turns off the program current in response to the feedback signal. The second resistance state can be established by inducing a crystalline phase in an active region of a phase change memory element in the memory cell.

The memory cell can have respective resistance states including the first resistance state and the second resistance state, and the reference voltage can have respective voltage levels corresponding to the respective resistance states. The memory cell includes a phase change memory element having an active region which changes phase under bias conditions applied during operation of the array. In embodiments of phase change memory, before any programming, the phase change memory element is in a crystalline or low resistance state. During operation, an active region may be reset into an amorphous or high resistance state or set into a crystalline or low resistance state. An active region in the memory element is in contact with a heater. For convenience of discussion, the region outside the active region in the phase change memory element is referred to as the inactive region. The magnitude and timing of a current pulse provided to program the active region, by the set and reset operations for the phase change memory element for example, determines the size of the active region and accordingly the size of the inactive region. A resistance state of the memory cell, such as the first resistance state and the second resistance state of the memory cell, includes the resistance state of the active region and the resistance state of the inactive region in the phase change memory element. Furthermore, an active region can be changed into one or more amorphous states at different resistance levels, for example, corresponding to different sizes of the active region.

For instance, the active region can be in an amorphous or high resistance state for the first resistance state of the memory cell, and a program operation is executed to change the memory cell in the first resistance state to a second resistance state where the active region is set into a crystalline or low resistance state. For instance, the active region can be in a first amorphous state for the first resistance state of the memory cell, and a program operation is executed to change the memory cell in the first resistance state to a second resistance state where the active region is in a second amorphous state with lower resistance than the first amorphous state.

The memory device can include a feedback path between an output of the differential amplifier providing the feedback signal to the current circuitry, where the feedback signal flows through the feedback path, and a switch connected in series with the feedback path to control the feedback signal. For instance, for an operation that does not utilize the current circuitry, the switch can be turned off to disable the current circuitry.

In one implementation, the current circuitry can include a first transistor having a first terminal connected to a power supply node (e.g., VDD), a second terminal connected to the bit line, and a gate terminal connected to a control signal; a second transistor having a first terminal connected to the power supply node, a second terminal connected to the control signal, and a gate terminal connected to the control signal; and a third transistor having a first terminal connected to a reference node (e.g., GND), a second terminal connected to the control signal, and a gate terminal connected to the feedback signal, where the power supply node is at a first voltage potential, and the reference node is at a second voltage potential lower than the first voltage potential. The memory cell can include a memory element and an access device connected to the memory element in series. The memory element can include a programmable resistance memory material, and the access device can include a first terminal connected to the memory element, a second terminal connected to the reference node, and a gate terminal connected to a word line.

A method for operating a memory device as described herein is also provided.

Other aspects and advantages of the present technology can be seen on review of the drawings, the detailed description and the claims, which follow.

DETAILED DESCRIPTION

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

Figure 1:
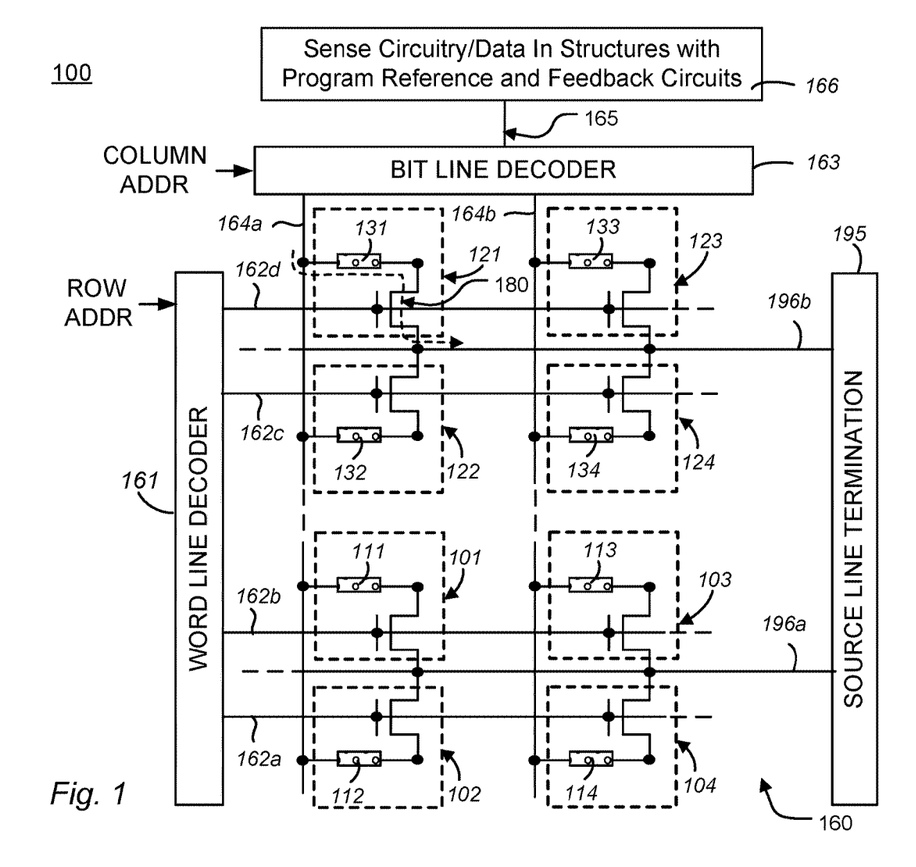
FIG. 1 is a simplified circuit diagram of a memory device including an array of programmable resistance memory cells.

FIG. 1 is a simplified circuit diagram of a memory device 100 including an array of programmable resistance memory cells (e.g. 160). The memory array 160 includes memory cells 101, 102, 103, and 104 having respective memory elements 111, 112, 113 and 114, coupled to respective access devices such as transistors. The memory array 160 can also include memory cells 121, 122, 123, and 124 having respective memory elements 131, 132, 133 and 134, coupled to respective access devices such as transistors. Alternatively, other access devices such as diodes or bipolar junction transistors can be used.

The memory array 160 includes a plurality of word lines (e.g. 162*a*, 162*b*, 162*c*, and 162*d*) extending in parallel in a first direction, and in electrical communication with word line decoder 161. The gates of access transistors of memory cells 102 and 104 are connected to word line 162*a*, the gates of access transistors of memory cells 101 and 103 are connected in common to word line 162*b*, the gates of access transistors of memory cells 122 and 124 are connected in common to word line 162*c*, and the gates of access transistors of memory cells 121 and 123 are connected in common to word line 162*d*.

The memory array 160 includes a plurality of bit lines (e.g. 164*a*, 164*b*) extending in parallel in a second direction perpendicular to the first direction, and in electrical communication with bit line decoder 163. As illustrated in the example of FIG. 1, each of the memory elements is arranged between the drain of the corresponding access device and the corresponding bit line. Alternatively, the memory elements may be on the source side of the corresponding access device. Sense circuitry (sense amplifiers) and data-in structures in block 166, including voltage and/or current sources for read, set, and reset operations are coupled to bit line decoder 163 via bit lines 165. In the illustrated embodiment, program reference and feedback circuits are disposed in electrical communication with the bit lines 165 and the sense circuitry and data in structures in block 166.

As illustrated in the example of FIG. 1, sources of the access devices in memory cells 101, 102, 103, and 104 are connected in common to source line 196*a* that terminates in a source line termination circuit 195, such as a reference node. In an alternative embodiment, the sources of the access devices are not electrically connects, but independently controllable. Sources of the access devices of memory cells 121, 122, 123 and 124 are connected in common to source line 196b that terminates in the source line termination circuit 195. The source line termination circuit 195 can include bias circuits such as voltage and current sources, and decoding circuits for applying bias arrangements other than ground to the source lines such as 196a and 196b in some embodiments.

In operation, each of the memory cells in the array 160 stores data depending upon the resistance of the corresponding memory element. The data value may be determined, for example, by comparison of voltage on a bit line for a selected memory cell to that of a suitable reference voltage by sense amplifiers of sense circuitry (block 166). The reference voltage can be established so that a predetermined range of voltages corresponds to a logical "0", and a differing range of voltages corresponds to a logical "1".

Reading or writing to a memory cell of array 160 can be achieved by applying a suitable voltage to one of word lines and coupling one of bit lines to a voltage source so that current flows through the selected memory cell. As illustrated in the example of FIG. 1, a current path 180 through a selected memory cell (in this example memory cell 121 and corresponding memory element 131) is established by applying voltages to the bit line 164a, word line 162d, and source line 196b sufficient to turn on the access transistor of memory cell 121 and induce current in path 180 to flow from the bit line 164a to the source line 196b, or vice-versa. The level and duration of the voltages applied is dependent upon the operation performed, e.g. a reading operation or a writing operation.

Figure 2:
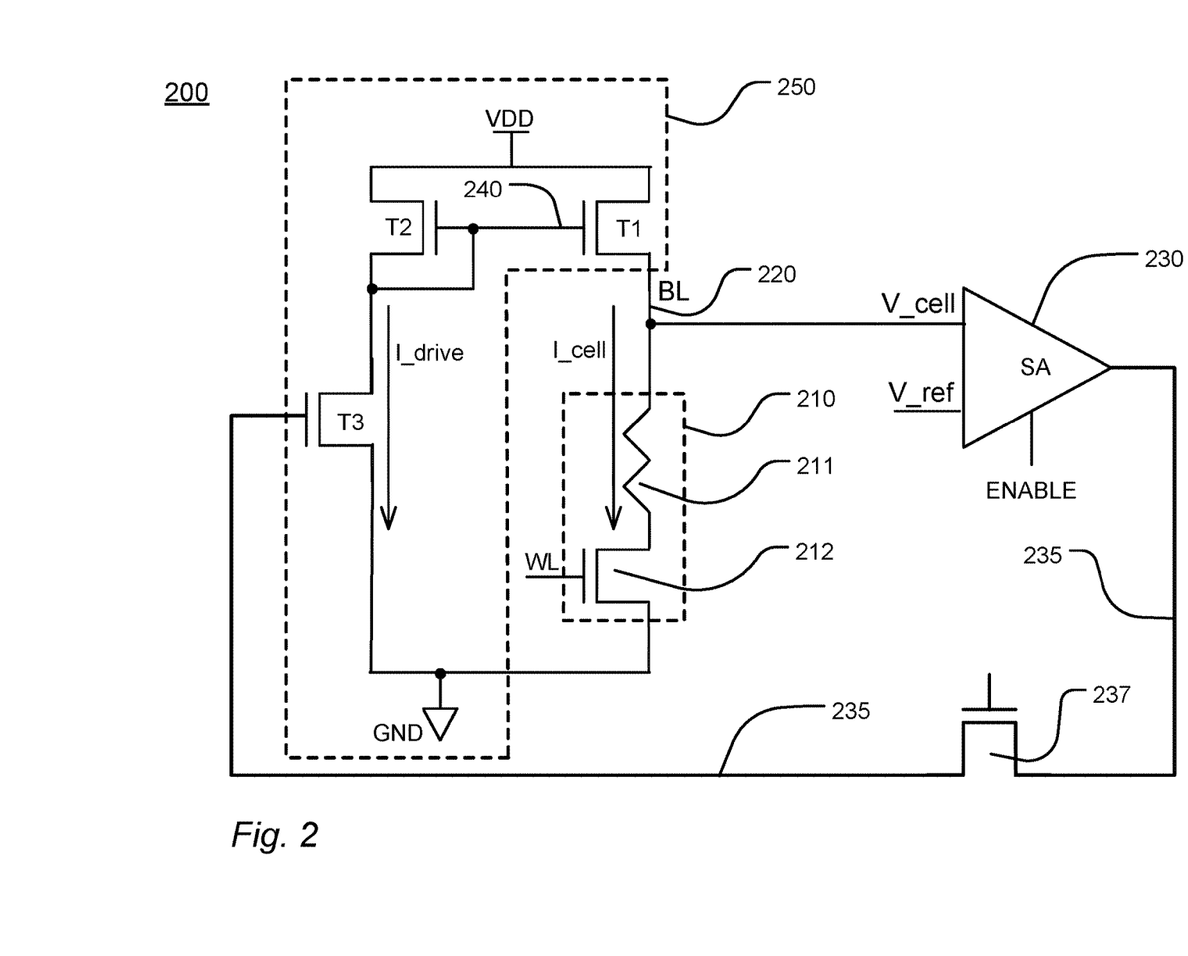
FIG. 2 is a simplified circuit diagram of a memory device including a current mirror circuit coupled to a bit line.

FIG. 2 is a simplified circuit diagram of a memory device including a current mirror circuit coupled to a bit line. A memory device 200 includes an array of programmable resistance memory cells, and a differential amplifier (e.g. 230) coupled to the array. The differential amplifier senses a voltage difference between a first voltage (e.g. V_cell) on a bit line (e.g. 220) coupled to a memory cell (e.g. 210) in the array and a reference voltage (e.g. V_ref), and provides a feedback signal (e.g. 235) in response to the voltage difference. The differential amplifier can be enabled via an enable signal ENABLE, so that the differential amplifier can provide an output signal in response to the voltage difference sensed between the first voltage V_cell and the reference voltage V_ref at inputs of the differential amplifier. The program reference and the feedback circuits described in connection with the sense circuitry/data in structures in block 166 as shown in FIG. 1 can include a reference voltage (e.g. V_ref), and a differential amplifier (e.g. 230) as shown in FIG. 2, respectively. Memory cells as shown in FIG. 1 (e.g. 101, 102, 103, 104, 121, 122, 123, 124) can include the memory cell (e.g. 210) as shown in FIG. 2.

The memory cell can include a programmable resistance memory material. The programmable resistance memory material can include chalcogenides, and other alloys of materials such as germanium (Ge), antimony (Sb), tellurium (Te), gallium (Ga), indium (In), silver (Ag), selenium (Se), thallium (Ti), bismuth (Bi), tin (Sn), copper (Cu), palladium (Pd), lead (Pb), sulfur (S), and gold (Au).

Current circuitry (e.g. 250) is coupled to the bit line to provide a program current (e.g. I_cell) to the bit line coupled to the memory cell. The current circuitry can include a first current path and a second current path, both between a power supply node (VDD) and a reference node (GND), where the power supply node is at a first voltage potential, and the reference node is at a second voltage potential lower than the first voltage potential. The first current path can provide the program current I_cell to the bit line coupled to the memory cell. The second current path can control a second current (e.g. I_drive) in response to the feedback signal (235). The program current I_cell mirrors the second current I_drive in magnitude.

As shown in the example of FIG. 2, a current circuitry can include a first current path including a first transistor (T1, FIG. 2), and a second current path including a second transistor (T2) and a third transistor (T3). The first transistor (e.g. T1) has a first terminal connected to a power supply node (VDD), a second terminal connected to the bit line (e.g. 220), and a gate terminal connected to a control signal (e.g. 240). The second transistor (e.g. T2) has a first terminal connected to the power supply node (VDD), a second terminal connected to the control signal (e.g. 240), and a gate terminal connected to the control signal (e.g. 240). A third transistor (e.g. T3) has a first terminal connected to a reference node (GND), a second terminal connected to the control signal (e.g. 240), and a gate terminal connected to the feedback signal (e.g. 235). Both the first current path and the second current path are between a power supply node (VDD) and a reference node (GND), where the power supply node is at a first voltage potential, and the reference node is at a second voltage potential lower than the first voltage potential.

The memory cell (e.g. 210) can include a memory element (e.g. 211) and an access device (e.g. 212) connected to the memory element in series. The memory element can include a programmable resistance memory material, and the access device can include a first terminal connected to the memory element, a second terminal connected to the reference node (GND), and a gate terminal connected to a word line (WL).

The memory device can include a feedback path between an output of the differential amplifier providing the feedback signal to the current circuitry, where the feedback signal flows through the feedback path, and a switch (e.g. 237) connected in series with the feedback path to control the feedback signal. For instance, for an operation, such as a read operation, that does not utilize the current circuitry, the switch can be turned off to disable the current circuitry.

Although as shown in the example of FIG. 2, current circuitry (e.g. 250) is coupled to one bit line, the current circuitry can be coupled to and shared by multiple bit lines (e.g. 164a, 164b, FIG. 1). In one implementation, the current circuitry can be coupled to and shared by multiple bit lines in a three-dimensional block of memory cells, where the block includes layers of memory cells arranged as two-dimensional arrays of memory cells.

Figure 3:
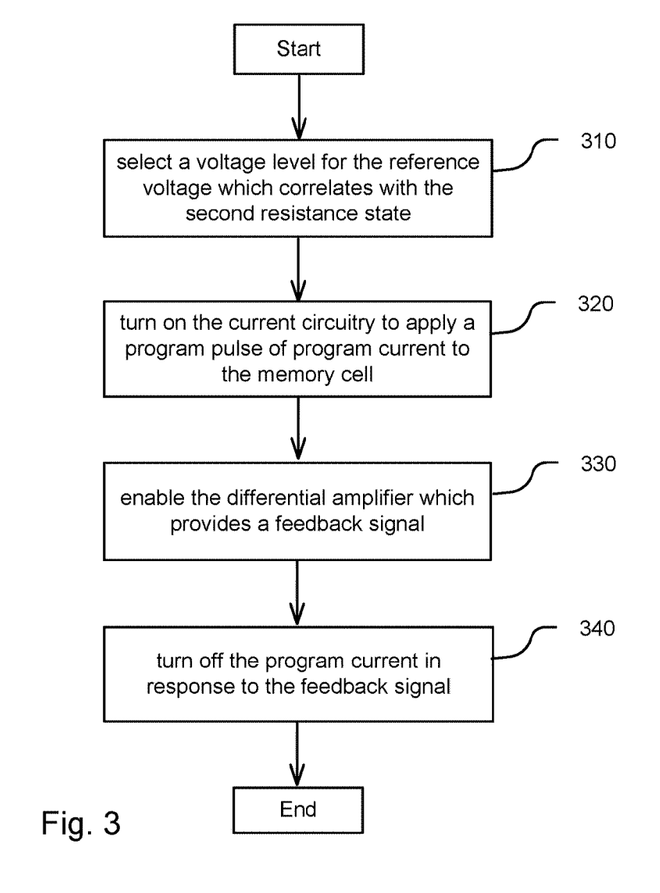
FIG. 3 is a simplified flowchart for changing a memory cell in a first resistance state to a second resistance state.

FIG. 3 is a simplified flowchart for changing a memory cell in a first resistance state to a second resistance state, where the second resistance state can be established by inducing crystalline phase regions in a phase change memory element in the memory cell. At Step 310, a voltage level is selected for the reference voltage which correlates with the second resistance state. For instance, an MLC (multiple level cell) memory cell can have four resistance ranges between three resistance values (e.g. 200 kohm, 400 kohm, 600 kohm), where each resistance range represents a logical level. For instance, a resistance range below 200 khom represents a first logical level, a resistance range between 200 khom and 400 khom represents a second logical level, a resistance range between 400 khom and 600 khom represents a third logical level, and a resistance range above 600 khom represents a fourth logical level.

At Step 320, the current circuitry is turned on to apply a program pulse of program current to the memory cell. The purpose of the program pulse of program current is to generate heat to re-crystalize the memory element in the memory cell. Applying the program pulse of program current can include applying a voltage pulse to a word line WL coupled to a control gate of the access device (e.g. 212, FIG. 2) in the memory cell (e.g. 210, FIG. 2), and providing a program current (e.g. I_cell, FIG. 2) to the bit line (e.g. 220, FIG. 2) coupled to the memory cell. The voltage pulse can include a rectangular waveform, a triangular waveform, a staircase waveform, or a hybrid of the waveforms. A second program pulse of program current subsequent to the first-mentioned program pulse of program current can be applied to the memory cell. Applying the second program pulse of program current can include applying a second voltage pulse to the memory cell. The second voltage pulse can include a rectangular waveform, a triangular waveform and a staircase waveform, or a hybrid of the waveforms. Various waveforms are further described in connection with FIGS. 4A, 4B, 4C, 4D, 5A, 5B, 5C and 5D. In one implementation of the present technology, the distribution of resistance ranges that represent logic levels is tightened by the real time resistance monitoring method as described herein. In an alternative implementation, the falling edge of a set pulse can be used to tighten the distribution in conjunction with the real time resistance monitoring method as described herein. To set the memory cell into the crystalline phase, a program pulse with a relatively fast rising edge can over-set the memory cell so the memory cell is set to outside the intended resistance range. In the present technology, a program pulse, such as a set pulse, can include a relatively slow rising edge to limit the set current from over-setting the memory cell.

At Step 330, the differential amplifier is enabled. The differential amplifier can be enabled after the first-mentioned program pulse of program current is applied to the memory cell, and between the first-mentioned program pulse of program current and the second program pulse of program current, as further described in connection with FIGS. 4A, 4B, 4C, 4D, 5A, 5B, 5C and 5D.

At Step 340, the current circuitry turns off the program current in response to the feedback signal from the differential amplifier. When the differential amplifier is enabled, the differential amplifier can provide a feedback signal in response to the voltage difference sensed between the first voltage V_cell (FIG. 2) and the reference voltage V_ref (FIG. 2) at inputs of the differential amplifier. After the current circuitry is turned on, a width of the program pulse of program current applied to the memory cell gets longer, the resistance of the memory element 211 in a memory cell 210 (FIG. 2) becomes lower, and the first voltage V_cell (FIG. 2) on the bit line 220 (FIG. 2) coupled to a memory cell becomes lower. Consequently, when the first voltage V_cell reaches the reference voltage V_ref (FIG. 2), the current circuitry 250 (FIG. 2) turns off the program current in response to the feedback signal 235 (FIG. 2) from the differential amplifier.

FIGS. 4A, 4B, 4C and 4D illustrate example program pulses that can be applied to a memory cell, when applying the program pulse of program current to the memory cell to change the memory cell in a first resistance state to a second resistance state, where the second resistance state can be a crystalline state and the program pulses can be a voltage magnitude. FIGS. 4A, 4B, 4C and 4D also indicate when the differential amplifier can be enabled relative to the program pulses.

Figures 4A, 4B:
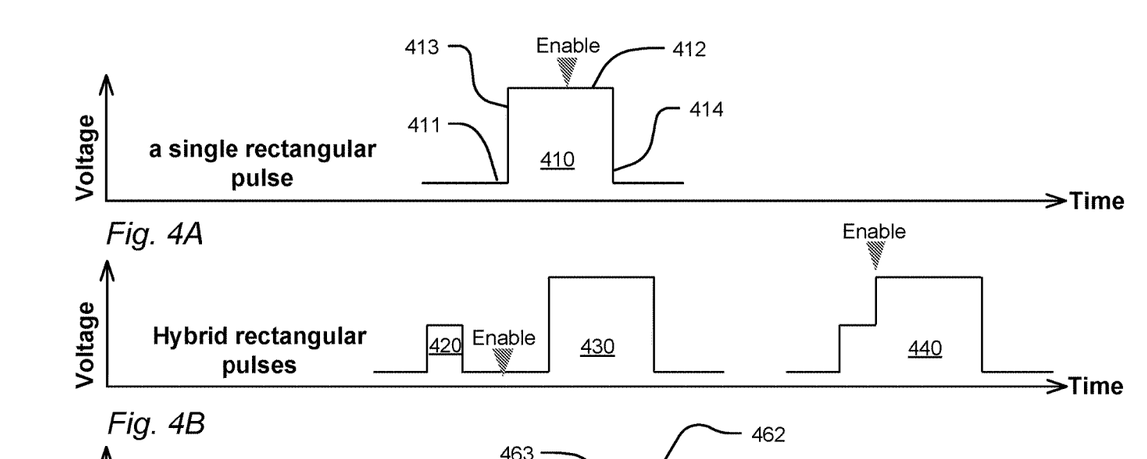
FIGS. 4A, 4B, 4C and 4D illustrate example program pulses, and indicate when the differential amplifier can be enabled relative to the program pulses.

FIG. 4A illustrates a single rectangular pulse 410 that can be applied to an access device (e.g. 212) of a memory cell (e.g. 210, FIG. 2) via a word line (e.g. WL, FIG. 2). A rectangular pulse transitions from a low amplitude (e.g. 411) to a high amplitude (e.g. 412) on a rising edge (e.g. 413), transitions from the high amplitude to the low amplitude on a falling edge (e.g. 414), and has a pulse width between the rising edge and the falling edge. The falling edge is created by the shutdown circuit of the write head, while a feedback signal (e.g. 235, FIG. 2) is detected from the differential amplifier (e.g. 230, FIG. 2). A write head is a circuit responsible for writing data to memory cells. For example, a sense amplifier can be coupled to a write head, and 128 sense amplifier in a bank of memory cells can be coupled to 128 write heads. The falling edge can be a relatively slow falling edge, although FIG. 4A shows a relatively fast falling edge. A total period of a rectangular pulse includes a rise time of the rising edge, a fall time of the falling edge, and the pulse width. The pulse width can have a minimum time of 10 ns. The differential amplifier (e.g. 230, FIG. 2) is enabled after the start, and before the end, of the single rectangular pulse as indicated by the arrow. For instance, the current circuitry (e.g. 250) can turn off the program current (e.g. I_cell, FIG. 2) in response to the feedback signal (e.g. 235, FIG. 2) before the end of the single rectangular pulse.

FIG. 4B illustrates hybrid rectangular pulses (e.g. 420, 430, 440) that can be applied to an access device (e.g. 212) of a memory cell (e.g. 210, FIG. 2) via a word line (e.g. WL, FIG. 2). In one example, a second rectangular pulse 430 subsequent to a first rectangular pulse 420 is applied, and the differential amplifier (e.g. 230, FIG. 2) is enabled between the first rectangular pulse and the second rectangular pulse. For instance, the current circuitry (e.g. 250) can turn off the program current (e.g. I_cell, FIG. 2) in response to the feedback signal (e.g. 235, FIG. 2) before the end of the second rectangular pulse. In another example, a hybrid pulse 440 is applied, that has a staircase portion followed by a rectangular portion, and the differential amplifier (e.g. 230, FIG. 2) is enabled by the end of the staircase portion. For instance, the current circuitry (e.g. 250) can turn off the program current (e.g. I_cell, FIG. 2) in response to the feedback signal (e.g. 235, FIG. 2) before the end of the hybrid pulse.

Figures 4C, 4D:
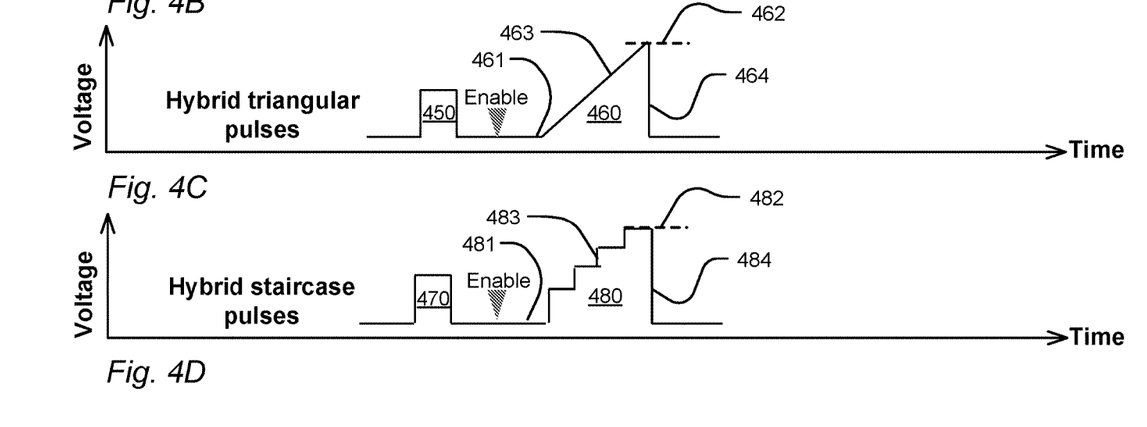

FIG. 4C illustrates hybrid rectangular/triangular pulses (e.g. 450, 460) that can be applied to an access device (e.g. 212) of a memory cell (e.g. 210, FIG. 2) via a word line (e.g. WL, FIG. 2). A triangular pulse transitions from a low amplitude (e.g. 461) to a high amplitude (e.g. 462) on a rising edge (e.g. 463), and then transitions from the high amplitude to the low amplitude on a falling edge (e.g. 464). A total period of a triangular pulse includes a rise time of the rising edge, and a fall time of the falling edge. In one example, a triangular pulse 460 subsequent to a rectangular pulse 450 is applied, and the differential amplifier (e.g. 230, FIG. 2) is enabled between the rectangular pulse and the triangular pulse. The current circuitry (e.g. 250) turns off the program current (e.g. I_cell, FIG. 2) in response to the feedback signal (e.g. 235, FIG. 2) before the end of the triangular pulse. After the differential amplifier is enabled, the rising edge (e.g. 463) increases in amplitude (e.g. voltage) when the program current is on. In other words, the rising edge keeps increasing in amplitude (e.g. voltage), and the program current (e.g. I_cell, FIG. 2) keeps increasing and flowing through the memory cell (e.g. 210, FIG. 2), as long as the feedback signal from the differential amplifier does not indicate to turn off the program current.

FIG. 4D illustrates hybrid rectangular/staircase pulses (e.g. 470, 480) that can be applied to an access device (e.g. 212) of a memory cell (e.g. 210, FIG. 2) via a word line (e.g. WL, FIG. 2). A staircase pulse transitions from a low amplitude (e.g. 481) to a high amplitude (e.g. 482) on a rising edge in a staircase shape (e.g. 483), and then transitions from the high amplitude to the low amplitude on a falling edge (e.g. 484). In one example, a staircase pulse 480 subsequent to a rectangular pulse 470 is applied, and the differential amplifier (e.g. 230, FIG. 2) is enabled between the rectangular pulse and the triangular pulse. For instance, the current circuitry (e.g. 250) can turn off the program current (e.g. I_cell, FIG. 2) in response to the feedback signal (e.g. 235, FIG. 2) before the end of the staircase pulse. After the differential amplifier is enabled, the rising edge in a staircase shape (e.g. 483) increases in amplitude (e.g. voltage) when the program current is on. In other words, the rising edge in a staircase shape keeps increasing in amplitude (e.g. voltage), and the program current (e.g. I_cell, FIG. 2) keeps increasing and flowing through the memory cell (e.g. 210, FIG. 2), as long as the feedback signal from the differential amplifier does not indicate to turn off the program current.

FIGS. 5A, 5B, 5C and 5D illustrate example program pulses that can be applied to a memory cell, when applying the program pulse of program current to the memory cell to change the memory cell in a first resistance state to a second resistance state, where the second resistance state can be a crystalline state and the program pulses can be a voltage magnitude. FIGS. 5A, 5B, 5C and 5D also indicate when the differential amplifier can be enabled relative to the program pulses.

Figures 5A, 5B:
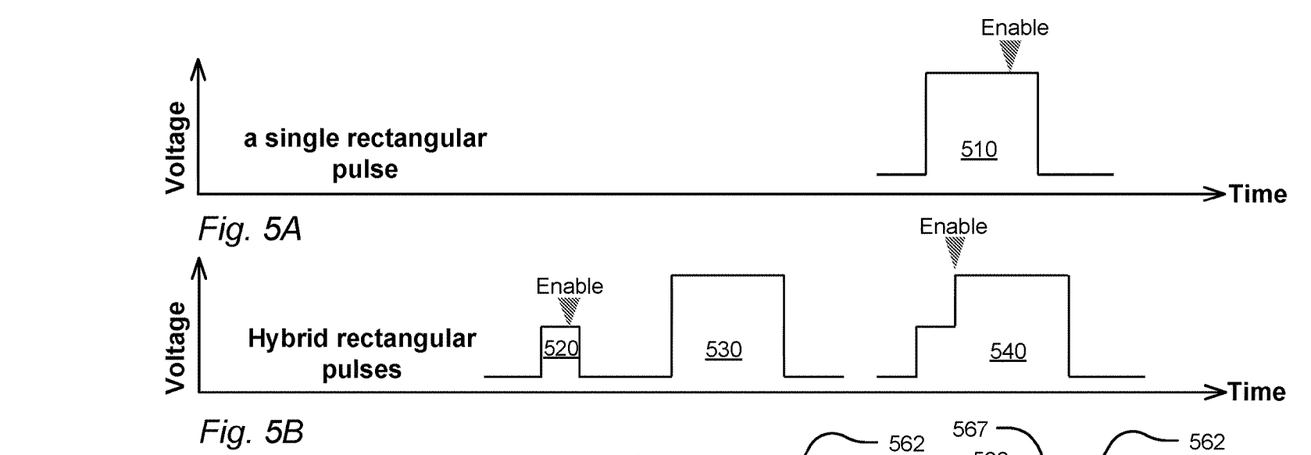
FIGS. 5A, 5B, 5C and 5D illustrate example program pulses, and indicate when the differential amplifier can be enabled relative to the program pulses.

FIG. 5A illustrates a single rectangular pulse 510 that can be applied to an access device (e.g. 212) of a memory cell (e.g. 210, FIG. 2) via a word line (e.g. WL, FIG. 2). The differential amplifier (e.g. 230, FIG. 2) is enabled earlier than the end of the single rectangular pulse as indicated by the arrow. For instance, the current circuitry (e.g. 250) can turn off the program current (e.g. I_cell, FIG. 2) in response to the feedback signal (e.g. 235, FIG. 2) before the end of the single rectangular pulse. Another rectangular pulse can be applied, if the feedback signal (e.g. 235, FIG. 2) to turn off the program current is not detected.

FIG. 5B illustrates hybrid rectangular pulses (e.g. 520, 530, 540) that can be applied to an access device (e.g. 212) of a memory cell (e.g. 210, FIG. 2) via a word line (e.g. WL, FIG. 2). In one example, a second rectangular pulse 530 subsequent to a first rectangular pulse 520 is applied, and the differential amplifier (e.g. 230, FIG. 2) is enabled earlier than the end of the first rectangular pulse. For instance, the current circuitry (e.g. 250) can turn off the program current (e.g. I_cell, FIG. 2) in response to the feedback signal (e.g. 235, FIG. 2) before the end of the second rectangular pulse. In another example, a hybrid pulse 540 is applied, that has a staircase portion followed by a rectangular portion, and the differential amplifier (e.g. 230, FIG. 2) is enabled by the end of the staircase portion. For instance, the current circuitry (e.g. 250) can turn off the program current (e.g. I_cell, FIG. 2) in response to the feedback signal (e.g. 235, FIG. 2) before the end of the hybrid pulse.

Figures 5C, 5D:
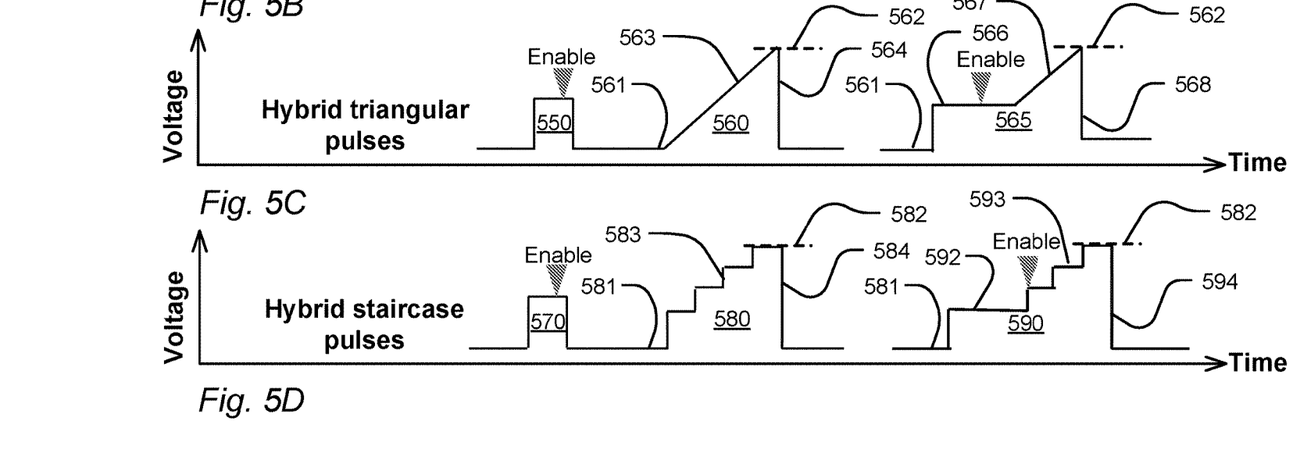

FIG. 5C illustrates hybrid rectangular/triangular pulses (e.g. 550, 560, 565) that can be applied to an access device (e.g. 212) of a memory cell (e.g. 210, FIG. 2) via a word line (e.g. WL, FIG. 2). A triangular pulse transitions from a low amplitude (e.g. 561) to a high amplitude (e.g. 562) on a rising edge (e.g. 563), and then transitions from the high amplitude to the low amplitude on a falling edge (e.g. 564). In one example, a triangular pulse 560 subsequent to a rectangular pulse 550 is applied, and the differential amplifier (e.g. 230, FIG. 2) is enabled earlier than the end of the rectangular pulse. For instance, the current circuitry (e.g. 250) can turn off the program current (e.g. I_cell, FIG. 2) in response to the feedback signal (e.g. 235, FIG. 2) before the end of the triangular pulse. In another example, a hybrid pulse (e.g. 565) is applied that has a rectangular portion followed by a triangular portion, and the differential amplifier (e.g. 230, FIG. 2) is enabled between the start and the end of the rectangular portion of the hybrid pulse. The triangular portion transitions from an intermediate amplitude (e.g. 566) between the low amplitude (e.g. 561) and the high amplitude (e.g. 562) to the high amplitude (e.g. 562) on a rising edge (e.g. 567), and then transitions from the high amplitude to the low amplitude on a falling edge (e.g. 568). For instance, the current circuitry (e.g. 250) can turn off the program current (e.g. I_cell, FIG. 2) in response to the feedback signal (e.g. 235, FIG. 2) before the end of the hybrid pulse. After the differential amplifier is enabled, the rising edge (e.g. 567) increases in amplitude (e.g. voltage) when the program current is on. In other words, the rising edge keeps increasing in amplitude (e.g. voltage), and the program current (e.g. I_cell, FIG. 2) keeps increasing and flowing through the memory cell (e.g. 210, FIG. 2), as long as the feedback signal from the differential amplifier does not indicate to turn off the program current.

FIG. 5D illustrates hybrid rectangular/staircase pulses (e.g. 570, 580, 590) that can be applied to an access device (e.g. 212) of a memory cell (e.g. 210, FIG. 2) via a word line (e.g. WL, FIG. 2). A staircase pulse transitions from a low amplitude (e.g. 581) to a high amplitude (e.g. 582) on a rising edge in a staircase shape (e.g. 583), and then transitions from the high amplitude to the low amplitude on a falling edge (e.g. 584). In one example, a staircase pulse 580 subsequent to a rectangular pulse 570 is applied, and the differential amplifier (e.g. 230, FIG. 2) is enabled earlier than the end of the rectangular pulse. For instance, the current circuitry (e.g. 250) can turn off the program current (e.g. I_cell, FIG. 2) in response to the feedback signal (e.g. 235, FIG. 2) before the end of the staircase pulse. In another example, a hybrid pulse (e.g. 590) is applied that has a rectangular portion followed by a staircase portion, and the differential amplifier (e.g. 230, FIG. 2) is enabled by the end of the rectangular portion of the hybrid pulse. The staircase portion transitions from an intermediate amplitude (e.g. 592) between the low amplitude (e.g. 581) and the high amplitude (e.g. 582) to the high amplitude (e.g. 582) on a rising edge in a staircase shape (e.g. 593), and then transitions from the high amplitude to the low amplitude on a falling edge (e.g. 594). For instance, the current circuitry (e.g. 250) can turn off the program current (e.g. I_cell, FIG. 2) in response to the feedback signal (e.g. 235, FIG. 2) before the end of the hybrid pulse. After the differential amplifier is enabled, the rising edge in a staircase shape (e.g. 593) increases in amplitude (e.g. voltage) when the program current is on. In other words, the rising edge keeps increasing in amplitude (e.g. voltage), and the program current (e.g. I_cell, FIG. 2) keeps increasing and flowing through the memory cell (e.g. 210, FIG. 2), as long as the feedback signal from the differential amplifier does not indicate to turn off the program current.

Figure 6:
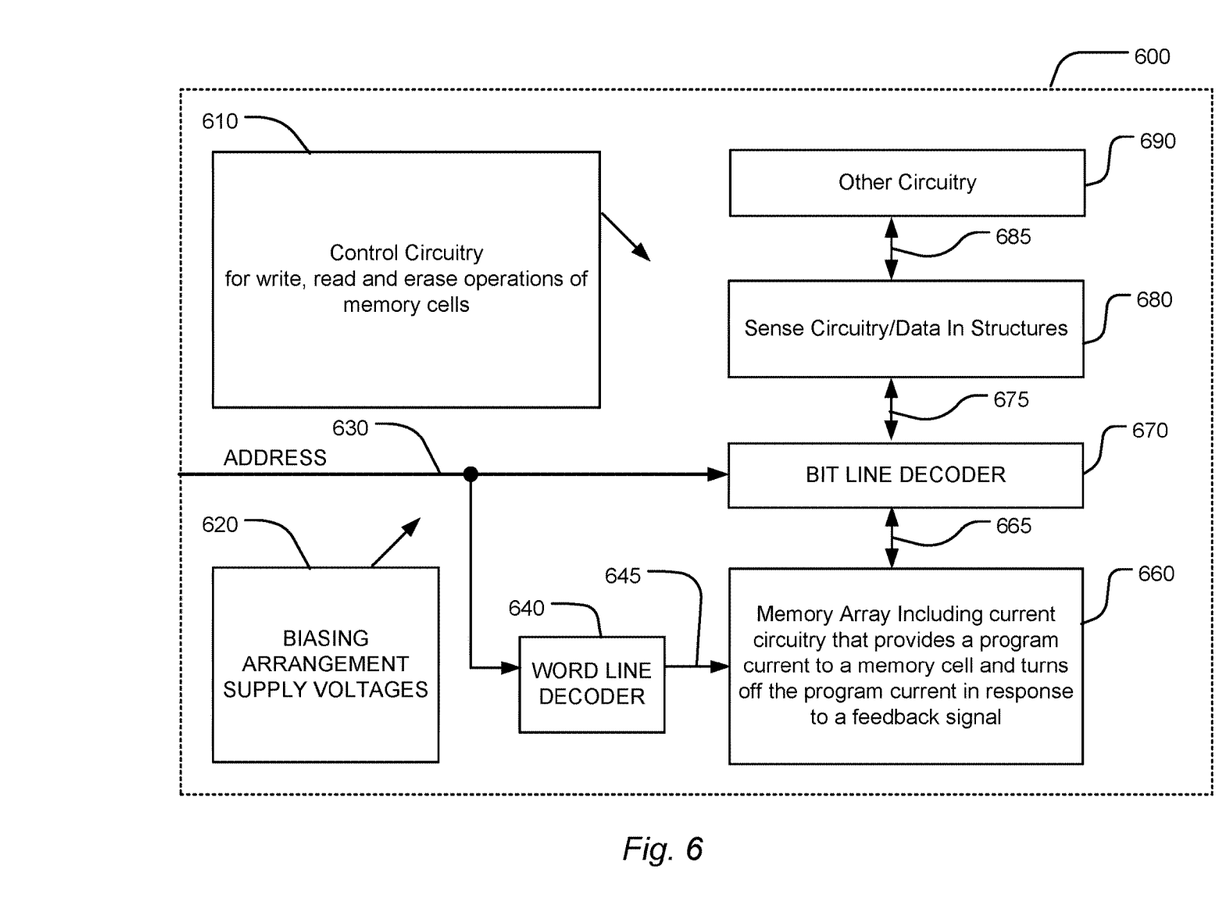
FIG. 6 is a simplified block diagram of an integrated circuit memory.

FIG. 6 is a simplified block diagram of an integrated circuit memory device 600. Memory device 600 includes an array of programmable resistance memory cells (e.g. 660), and a differential amplifier (e.g. 230, FIG. 2) coupled to the array. The differential amplifier senses a voltage difference between a first voltage on a bit line (e.g. 220) coupled to a memory cell (e.g. 210, FIG. 2) in the array (e.g. 660) and a reference voltage, and provides a feedback signal (e.g. 235, FIG. 2) in response to the voltage difference. Memory device 600 includes current circuitry (e.g. 250, FIG. 2) coupled to the bit line to provide a program current to the bit line coupled to the memory cell.

Memory device 600 includes control circuitry (e.g. 610) coupled to the array and the differential amplifier, and configured to execute a program operation to change the memory cell in a first resistance state to a second resistance state including selecting a voltage level for the reference voltage which correlates with the second resistance state, turning on the current circuitry to apply a program pulse of program current to the memory cell, and enabling the differential amplifier, where the current circuitry turns off the program current in response to the feedback signal.

The control circuitry 610, implemented for example as a state machine, provides signals to control the application of bias arrangement supply voltages generated or provided through the voltage supply or supplies in block 620 to carry out the various operations including write, read and erase operations of memory cells. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

In some embodiments, the memory array 660 can include single level cells (SLC). In other embodiments, the memory array 660 can include multiple level cells (MLC). A word line decoder 640 is coupled to a plurality of word lines 645 arranged along rows in the memory array 660. Bit line decoder 670 is coupled to the memory array 660 via global bit lines 665. Global bit lines 665 are coupled to local bit lines (not shown) arranged along columns in the memory array 660. Addresses are supplied on bus 630 to bit line decoder 670 (column address) and word line decoder 640 (row address). Sense circuitry/data-in structures in block 680, including voltage and/or current sources for the write, read and erase operations, are coupled to bit line decoder 670 via data bus 675. Sense circuitry/data-in structures in block 680 can include the reference voltage (e.g. V_ref, FIG. 2), and the differential amplifier (e.g. 230, FIG. 2). Data is supplied via the line 685 to/from other circuitry 690 on the integrated circuit, such as a general purpose processor or special purpose application circuitry, or a combination of modules providing system-on-a-chip functionality supported by the integrated circuit memory 600. Other circuitry 690 can include for example input/output ports. The line 685 can include an output data line between an output of the differential amplifier in sense circuitry 680 and an input of a data output multiplexer in other circuitry 690.

The present technology is applicable to other memory technologies that need programming verify, including CBRAM (Conductive Bridging Random Access Memory) and ReOXRAM (Refractory metal oxide RAM).

While the present technology is disclosed by reference to the preferred embodiments and examples detailed herein, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory device, comprising:
an array of programmable resistance memory cells;
a differential amplifier coupled to the array, wherein the differential amplifier senses a voltage difference between a first voltage on a bit line coupled to a memory cell in the array and a reference voltage, and provides a feedback signal in response to the voltage difference, wherein the memory cell comprises a memory element and an access device connected to the memory element in series, and the access device includes a gate terminal connected to a word line;
current circuitry coupled to the bit line to provide a program current to the bit line coupled to the memory cell; and
control circuitry coupled to the array and the differential amplifier, and configured to execute a program operation to change the memory cell in a first resistance state to a second resistance state including selecting a voltage level for the reference voltage which correlates with the second resistance state, applying a word line pulse having a pulse shape on the word line, turning on the current circuitry to apply a program pulse of program current to the memory cell, and enabling the differential amplifier,
wherein the current circuitry turns off the program current in response to the feedback signal before termination of the word line pulse.

2. The memory device of claim 1, wherein the second resistance state is established by inducing a crystalline phase in an active region of a phase change memory element in the memory cell.

3. The memory device of claim 1, wherein the memory cell includes a programmable resistance memory material.

4. The memory device of claim 1, wherein the memory cell has respective resistance states including the first resistance state and the second resistance state, and the reference voltage has respective voltage levels corresponding to the respective resistance states.

5. The memory device of claim 1, including:
a feedback path between an output of the differential amplifier providing the feedback signal to the current circuitry, wherein the feedback signal flows through the feedback path; and
a switch connected in series with the feedback path to control the feedback signal.

6. A memory device, comprising:
an array of programmable resistance memory cells;
a differential amplifier coupled to the array, wherein the differential amplifier senses a voltage difference between a first voltage on a bit line coupled to a memory cell in the array and a reference voltage, and provides a feedback signal in response to the voltage difference;
current circuitry coupled to the bit line to provide a program current to the bit line coupled to the memory cell, the current circuitry including:
a first transistor having a first terminal connected to a power supply node, a second terminal connected to the bit line, and a gate terminal connected to a control signal;
a second transistor having a first terminal connected to the power supply node, a second terminal connected to the control signal, and a gate terminal connected to the control signal; and
a third transistor having a first terminal connected to a reference node, a second terminal connected to the control signal, and a gate terminal connected to the feedback signal, wherein the power supply node is at a first voltage potential, and the reference node is at a second voltage potential lower than the first voltage potential; and control circuitry coupled to the array and the differential amplifier, and configured to execute a program operation to change the memory cell in a first resistance state to a second resistance state including selecting a voltage level for the reference voltage which correlates with the second resistance state, turning on the current circuitry to apply a program pulse of program current to the memory cell, and enabling the differential amplifier, wherein the current circuitry turns off the program current in response to the feedback signal.

7. The memory device of claim 6, wherein the memory cell comprises:

a memory element and an access device connected to the memory element in series.

8. The memory device of claim 7, wherein the second resistance state is established by inducing a crystalline phase in an active region of the memory element in the memory cell.

9. The memory device of claim 7, wherein the memory element includes a programmable resistance memory material.

10. The memory device of claim 7, wherein the access device includes a first terminal connected to the memory element, a second terminal connected to the reference node, and a gate terminal connected to a word line.

11. The memory device of claim 6, wherein the memory cell has respective resistance states including the first resistance state and the second resistance state, and the reference voltage has respective voltage levels corresponding to the respective resistance states.

12. A method for operating a memory device, the memory device comprising an array of programmable resistance memory cells, a differential amplifier coupled to the array, wherein the differential amplifier senses a voltage difference between a first voltage on a bit line coupled to a memory cell in the array and a reference voltage, and provides a feedback signal in response to the voltage difference, wherein the memory cell comprises a memory element and an access device connected to the memory element in series, and the access device includes a gate terminal connected to a word line, and current circuitry coupled to the bit line to provide a program current to the bit line coupled to the memory cell, the method comprising:

executing a program operation to change the memory cell in a first resistance state to a second resistance state including selecting a voltage level for the reference voltage which correlates with the second resistance state, applying a word line pulse having a pulse shape on the word line, turning on the current circuitry to apply a program pulse of program current to the memory cell, enabling the differential amplifier, and turning off the program current in response to the feedback signal, wherein the current circuitry turns off the program current in response to the feedback signal before termination of the word line pulse.

13. The method of claim 12, wherein said enabling the differential amplifier is subsequent to said turning on the current circuitry.

14. The method of claim 12, wherein subsequent to said enabling the differential amplifier, the program pulse of program current includes a rising edge increasing in amplitude when the program current is on.

15. The method of claim 12, comprising applying a second program pulse of program current subsequent to said applying the program pulse of program current to the memory cell.

16. The method of claim 15, wherein said enabling the differential amplifier is executed between the program pulse of program current and the second program pulse of program current.

17. The method of claim 15, wherein subsequent to said enabling the differential amplifier, the second program pulse of program current includes a rising edge increasing in amplitude when the program current is on.

* * * * *